(12) United States Patent
Marcotte

(10) Patent No.: US 8,493,773 B2
(45) Date of Patent: Jul. 23, 2013

(54) MEMORY BASED ILLUMINATION DEVICE

(76) Inventor: Robert G Marcotte, New Paltz, NY (US)

( * ) Notice: Subject to any disclaimer, the term of this patent is extended or adjusted under 35 U.S.C. 154(b) by 66 days.

(21) Appl. No.: 13/296,323

(22) Filed: Nov. 15, 2011

(65) Prior Publication Data

US 2013/0121064 A1 May 16, 2013

(51) Int. Cl.
*G11C 11/24* (2006.01)
*G11C 11/40* (2006.01)

(52) U.S. Cl.
CPC ..................... *G11C 11/40* (2013.01)
USPC ........... 365/149; 365/105; 365/115; 365/175; 365/174; 365/189.09

(58) Field of Classification Search
CPC ......... G11C 11/40; G11C 11/404; G11C 11/36
USPC ................. 365/149, 105, 115, 175, 243, 159, 365/180
See application file for complete search history.

(56) References Cited

U.S. PATENT DOCUMENTS

2010/0220532 A1* 9/2010 Fellner et al. ............ 365/185.25

* cited by examiner

*Primary Examiner* — Thong Q Le

(57) ABSTRACT

The invention contained herein provides electrical circuits and driving methods to operate a memory cell comprising a capacitance coupled to a breakover conduction switch such as a thyristor, DIAC or one or more complementary transistor pairs. The memory cell comprises a cell capacitance for storing a memory state and for capacitively coupling an applied voltage to the switch. During operation, pulses are applied to write, read or maintain the cell's memory state. An illumination cell comprises an LED, OLED or electroluminescent material in series with each memory cell. Breakover conduction charge passes through the switch and the emissive element to charge the cell capacitance. A memory array of breakover conduction memory cells may be organized into rows and columns for reading and writing an addressable array memory cells. An organic light emitting display memory array may be fabricated using organic light emitting devices and/or materials.

30 Claims, 2 Drawing Sheets

MEMORY BASED ILLUMINATION DEVICE

BACKGROUND OF THE INVENTION

1. Field of the Invention

This patent relates to the field of addressable memory cells and in particular to those used for illumination and display devices. The invention provides to a memory cell utilizing breakover conduction for storing a charge corresponding to an illumination state while providing a controlled and limited current through an emissive element to provide illumination. An organic light emitting memory array incorporates an array of memory cells fabricated with organic semi-conductive materials.

2. Description of the Related Art

Dielectric barrier discharge devices such as plasma display panels (PDPs) set a wall charge on a dielectric surface according to a display image. During operation, an initialization period initializes the wall charge of each illumination cell; during an addressing period, rows of illumination cells are selected and wall charges are set according to display data; and during a sustain period, set wall charges are maintained while producing illumination. These devices have the desirable feature of capacitive memory at each discharge location and capacitively controlled illumination power. Such devices are costly to manufacture and have a need for improved luminous efficacy and other reductions in power consumption.

A PDP, being a gas discharge device, contains a dischargeable gas which exhibits a breakover characteristic. When de-energized, the dischargeable gas is capacitive, having high impedance. When a voltage is applied across the dischargeable gas, in excess of the breakdown voltage of the dischargeable gas, the dischargeable gas becomes energized and therefore conductive only while a voltage is maintained across the dischargeable gas. As current flows through the dischargeable gas, electrical charges are transferred between dielectric surfaces. Once the dielectric surfaces are charged and the voltage across the gas is reduced to zero, the dischargeable gas de-energizes and returns to the high impedance state.

Active matrix organic light emitting diode (AMOLED) displays offer improved luminous efficacy over PDP's but require a substantially constant current flow through each illumination cell to provide illumination in proportion to a display image. Electrode resistance affects the brightness uniformity of these devices and limits their size. To enable large area displays, methods are needed to control the current while maintaining high operating efficiency.

Non-gaseous, i.e. semiconductor based, breakover conduction devices are commonly used for activating AC switches such as TRIACs. These breakover conduction devices exhibit high impedance, i.e. a capacitive characteristic, prior to the application of a voltage thereacross greater than the device's predetermined breakover voltage. Once the devices breakover voltage is exceeded, the device switches to a low impedance state while current through the device is maintained. An AC diode (DIAC) is a simple two terminal bidirectional breakover conduction device. Once the voltage applied (positive or negative) across a DIAC exceeds its breakover voltage, it turns on, self-latching into a conductive state until the current flowing through the device decreases below a minimum holding current. Such devices do not have memory nor an ability of limit current flow.

SUMMARY OF THE INVENTION

The invention contained herein provides electrical circuits and driving methods to operate an emissive apparatus comprising a capacitively coupled semi-conductive breakover conduction device. According to the invention, a memory cell comprises a cell capacitance for storing a memory state and for capacitively coupling an applied voltage to a bidirectional breakover conduction device henceforth referred to as a switch. During operation, pulses are applied to one or more memory cells to write, read or maintain the cell's memory state. Each cell capacitance has a cell voltage that when added to an applied pulse voltage, may or may not apply a voltage across the switch sufficient to exceed the switch's predetermined breakover voltage. If, during the application of a voltage, the voltage across the switch exceeds the switch's predetermined breakover voltage, the applied voltage will trigger the switch to transition from a high impedance state to a self-latched low impedance state. The switch will remain conductive until the current flow through the switch drops below a predetermined opening threshold, typically concurrent with the cell capacitance being charged to the applied voltage. Once the switch opens, the switch returns to the high impedance state, thus storing the charges set during the low impedance state according to one or memory states. Subsequently, the pulse applies a second application voltage, opposite in direction to the first application voltage. Again, the cell voltage is additive to the second application voltage and may be sufficient to re-trigger the switch into conduction as previously described. Thus, the cell capacitance and the breakover conduction switch form a memory cell.

An illumination device may be controlled by disposing at least one emissive element or emissive device such as an LED, OLED or electroluminescent material in series with each memory cell. Each time the switch conducts; the charge passing through the capacitance and switch is channeled through the emissive element and limited by the cell capacitance. Illumination power is limited by the size (value) of the capacitance and the applied voltage.

An addressable memory array is disclosed wherein a plurality of memory cells are disposed at the electrode crossings of horizontal row electrodes and vertical column electrodes. Coupling an emissive element to each memory cells provides a light emitting display memory array (LEDMA), and an organic light emitting display memory array (OLEDMA) may be produced using organic semi-conductors. Such a memory array may be operated in a variety of ways from single cell addressing to plasma display subfield driving methods; field sequential driving methods and raster/scan driving methods as are known in the art of display technology.

DETAILED DESCRIPTION

Figure 1:
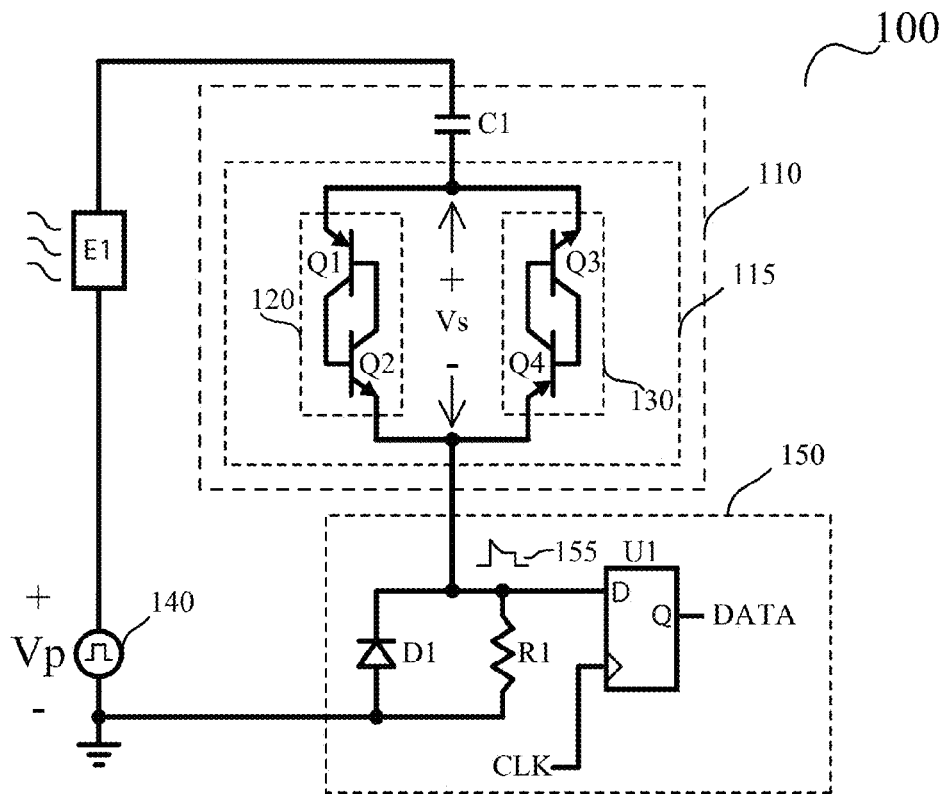
FIG. 1 provides a schematic model of the invention

FIG. 1 illustrates an embodiment according to the invention for an apparatus 100 comprising a memory cell 110 that controls and limits the current flow through an emissive element E1. Memory cell 110 comprises; a cell capacitance C1 for storing a cell charge indicative of memory states and a bidirectional breakover conduction switch 115, that switches into conduction when a voltage Vs thereacross, exceeds predetermined positive or negative breakover voltages. A pulse generator 140 is capable of producing pulses having rising and falling transitions Vp of one or more amplitudes. The pulse voltage Vp is coupled through emissive element E1 and the cell capacitance C1 to apply a voltage Vs across breakover conduction device 115. Lastly, an optional read circuit 150 comprises a diode D1, a current sense resistor R1 and a register U1. Pulse 155 illustrates the voltage produced across resistor R1 during a conduction of breakover conduction device 115.

To illustrate a bidirectional breakover switch exemplary of the invention, breakover conduction device 115 comprises an arrangement of switches 120 and 130 that typify the operation of a DIAC. Each switch 120 and 130 comprises respective PNP transistors Q1 and Q4 and NPN transistors Q2 and Q3. Each switch's PNP/NPN transistor pair is configured with cross coupled bases and collectors so that if either transistor becomes conductive, the other will turn on and thus the pair will self-latch as long as current flows through the switch. Note that switch 130 has an orientation opposite to that of switch 120 to facilitate bidirectional operation. Thus, switch 120 self-latches upon reaching a predetermined positive breakover voltage +Vbr and switch 130 self-latches upon reaching a predetermined negative breakover voltage −Vbr. Asymmetrical operation can be achieved if the positive and negative breakover voltages are not equal.

As a rising transition of pulse voltage Vp is applied between the emitters of each complementary transistor pair, switch 120 will remain off, i.e. in a high impedance state while a positive switch voltage Vs increases but remains less than the breakdown voltage of the transistor pair. Once the switch voltage Vs increases above a reversed biased pn junction's breakdown voltage of either transistor's (Q1 or Q2) cross-coupled collector/base, the breakdown current with cause both transistors to turn on and self-latch in the ON, i.e. low impedance state. As current flows through cell capacitance C1, the emissive element E1 and switch 120, the applied voltage Vp shifts from being across the switch to across cell capacitance C1. Once cell capacitance C1 is charged to the applied voltage Vp, the current flow through the switch falls below a predetermined holding current, the switch will open (switch OFF) and return to the high impedance state. Subsequently, during a falling transition of pulse voltage Vp, switch 130 will maintain a high impedance until it's negative breakover voltage is exceeded, whereupon, it turns on and conducts current in the opposite direction, relative to switch 120, until cell capacitance C1 is discharged. Thus, following the conduction of switch 130 the memory state stored across cell capacitance is maintained.

Alternatively, the bidirectional arrangement of switches 120 and 130 may be attained by a thyristor implementation such as using two N-channel/P-channel FET transistor pairs or two silicon controlled rectifiers (SCR)'s, or a single AC diode (DIAC or SIDAC). DIACs and SIDACs are two terminal bipolar junction devices that conduct in either direction once a predetermined breakover voltage is reached. SIDACs typically operate at higher voltages than DIACs with precisely controlled breakover voltages. Fabricating the breakover switch 115 with N-channel/P-channel FET transistor pairs facilitates using conventional Thin-Film-Transistor (TFT) processes commonly used in LCD and OLED displays.

The emissive element provides one or more emissions of; visible light (red, green, blue, white or in combination), infrared light or ultraviolet light, and may comprise one or more of; an organic electroluminescent material, a dischargeable gas, or an emissive device such as a light emitting diode (LED) or organic LED (OLED).

Given ongoing developments within the field of emissive semiconductors and semi conductive materials, the breakover conduction devices may be fabricated using emissive materials as well. LEDs and OLEDs generally comprise an emissive pn junction. That is, a semiconductor LED is comprises a pn junction, essentially mating surface areas, wherein a layer of a positively doped (p-type) semi-conductive material (silicon) meets a negatively doped semi-conductive material. When a forward voltage is applied to the pn junction, current flows though the pn junction and light is emitted according to characteristics of the semi-conductive materials. In some LED devices, the LED emits ultraviolet light which is used to excite a phosphor material. Organic semi-conductive devices represent an evolving technology based upon polymer technologies. Semi-conductive polymers are used to many applications, including transparent electrodes, field effect transistors (FETs), light emitting diodes and 'glow-in-the-dark' materials. Thus, usage of organic semiconductors is not limited to electroluminescent devices, and in fact the cell capacitance C1, breakover switch 115 and emissive element E1 may all be fabricated into a single organic device.

Figure 2:
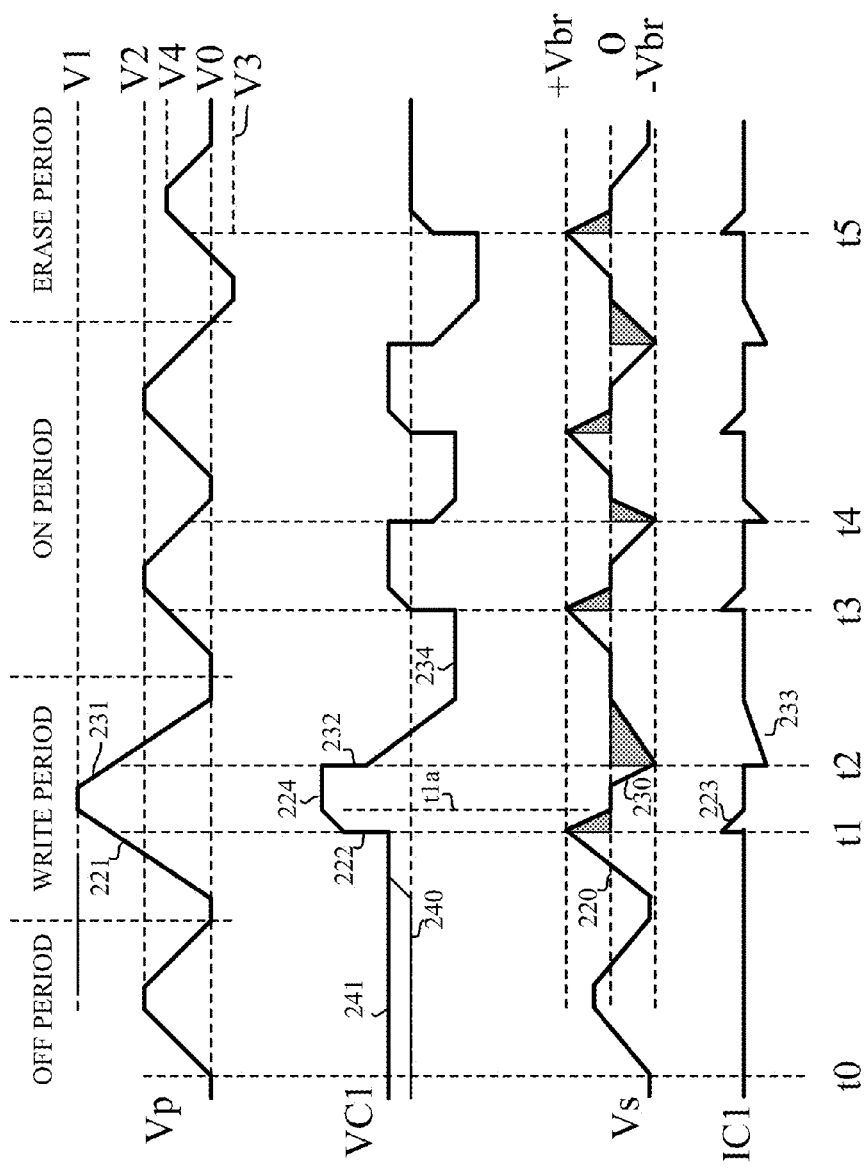
FIG. 2 illustrates an operating method for the model of FIG. 1

FIG. 2 illustrates an exemplary method for operating apparatus 100. Waveform Vp is the output of pulse generator 140 having a V0 reference, a writing voltage V1, a maintaining or reading voltage V2 and erase voltages V3 and V4. Waveform VC1 illustrates the voltage across cell capacitance C1. Waveform Vs illustrates the voltage across bidirectional breakover switch pair 120/130. Whenever the switch voltage Vs exceeds the positive breakover voltage +Vbr, switch 120 closes until the rising transition of waveform Vp completes. Likewise, whenever the switch voltage Vs exceeds the negative breakover voltage −Vbr switch 130 closes until the falling transition of waveform Vp completes. Shadow areas indicate periods of positive and negative conductivity for breakover switch 115 and specifically for switches 120 and 130 respectively. Lastly, waveform IC1 illustrates the current flow through capacitance C1 and breakover switch 115 and specifically through switch pair 120/130 with positive currents flowing through switch 120 and negative currents flowing through switch 130.

Pulses applied by pulse generator 140 are illustrated with triangular (ramping) transitions to more clearly illustrate the operation of the invention. Embodiments of the invention may use any type of square or time varying pulse. If large cell capacitances are to be driven with high voltages, pulse generator 140 may comprise a resonant driving circuit to allow for reductions in power consumption. Such circuits are common in the art of plasma display driving electronics and may be readily applied.

During an OFF Period, indicative of an off, cleared or zero memory state, pulse generator 140 applies a pulse having a voltage V2 which, after being coupled through cell capacitance C1, voltage Vs is less than the positive breakover voltage +Vbr. As shown, beginning at time t0, waveform Vp rises from the reference voltage V0 to voltage V2. Applying the voltage V2, to memory cell 110 through capacitance C1, yields substantially the same pulse voltage across the switch pair 120/130 as shown on waveform Vs. That is, beginning at time t0, a pulse Vp of magnitude V2 is coupled through cell capacitance C1 to apply a voltage Vs across switch 120. With the voltage VC1 at a neutral level 241 indicative of an off state, the voltage Vs across switch pair 120/130 is less than the positive breakover voltage +Vbr and switch 120 will remain in the high impedance state for the remainder of the pulse.

During the first portion of a write period, pulse generator 140 produces a writing pulse on waveform Vp having a rising transition 221 reaching a writing voltage V1 which may be approximately twice the positive breakover voltage +Vbr. As shown on waveform Vs, the pulse voltage 220, across switch 120, increases as driven by transition 221. At time t1, voltage Vs (across switch 120) reaches the breakover voltage +Vbr of switch 120, and switch 120 turns on rapidly, inducing current pulse 223 shown on waveform IC1, through switch 120 and capacitance C1 which in-turn charges capacitance C1 (transition 222). As pulse voltage 221 continues to rise to the writing voltage V1, switch 120 remains in a low impedance state and current pulse 223 extends until the writing voltage V1 is reached. Consequently, the voltage across capacitance C1 continues to increase until reaching voltage level 224 when the rising transition of pulse 221 completes. With cell capacitance C1 charged to voltage V1, the voltage across, and the current through, switch 120 is reduced to substantially zero, and switch 120 turns off, returning to the high impedance state.

Note that the entry point cell capacitance voltage, i.e. voltage level 241 at time t0 may be variable, thus if the entry voltage is at an initialized level 240, applying rising transition 221 causes the positive breakover voltage +Vbr will be reached sooner, and time t1 will occur earlier. Despite an earlier turn on of switch 120, the final voltage 224 attained across cell capacitance C1 remains the same. Thus, by adjusting the writing voltage V1, a plurality of memory cells 110 having different cell voltages may be set to a common level.

During a second portion of the write period, pulse generator 140 produces a falling transition 231 reaching the reference voltage V0. As shown on waveform Vs, the pulse voltage 230 across switch 130 decreases as driven by transition 231. At time t2, voltage Vs (across switch 130) reaches the breakover voltage −Vbr of switch 130, and switch 130 turns on rapidly, inducing current pulse 233, shown on waveform IC1, through switch 130 and capacitance C1 which in-turn charges capacitor C1 (transition 232). As pulse voltage 231 continues to fall to the reference voltage V0, switch 130 remains in a low impedance state and current pulse 233 is extended until the reference voltage V0 is reached. Consequently, the voltage across capacitance C1 continues to decrease until reaching voltage level 234 when the falling transition of pulse 231 completes. With cell capacitance C1 discharged to voltage V0, the voltage across, and the current through, switch 130 is reduced to substantially zero and switch 130 turns off, returning to the high impedance state.

Note that a plurality of memory cells having a written cell capacitance voltage, i.e. voltage level 224, will substantially switch at a common time t2, and the plurality of memory cells can be set, in common, to the voltage level 234. And, relative to the neutral cell voltage VC1, at time t0, the voltage across cell capacitance C1 has been shifted to an ON state represented by voltage level 234 from the OFF state represented by the region between level 241 and initialized level 240.

Subsequently, during an ON Period, pulse generator 140 produces a plurality of pulses reaching the maintaining or reading voltage V2. With each rising and falling transition, memory cells set during the preceding write period cause switches 120 and 130 to close at times t3 and t4 respectively. A "written" cell may be "read" by clocking register U1 of FIG. 1 with a clock pulse CLK during the conductive time t3 wherein the voltage pulse 155 of FIG. 1 is produced across resistor R1 due to current flow IC1 at time t3.

An erase period neutralizes the charge stored in the cell capacitance so that during subsequent applications of voltage V2 during OFF periods, an off, erased or initialized cell will remain in the off state. To erase or reset (i.e. initialize) a memory cell into an off state, the final ON Period pulse's falling transition reaches a negative voltage V3 so that applying erase voltage V4 triggers conductivity at time t5 to set the charge on cell capacitance C1 so that the voltage thereacross is approximately equal to the initialized level 240 and so that when the erase pulse returns to the reference voltage V0, the voltage across the switch pair 120/130 Vs remains above the negative breakover voltage −Vbr. Thus, the on state level 234 is shifted to the off state level 240.

Using the above methods memory cells may be initialized, written, read and erased according to breakover conduction operating methods Likewise, a memory based display pixel may be formed, comprising an emissive element disposed in series with the memory cell. Thus the display pixel may be initialized, selectively illuminated according to display data utilizing a writing method, and the brightness may be controlled by the voltage and number of illumination pulses applied in an ON Period. In essence, a solid-state plasma display panel may thus be devised, wherein a single cell capacitance replaces the pair of dielectric surface capacitances, a breakover conduction switch replaces the dischargeable gas and an LED or OLED replaces the dischargeable gas excitation/phosphor emission.

Figure 3:
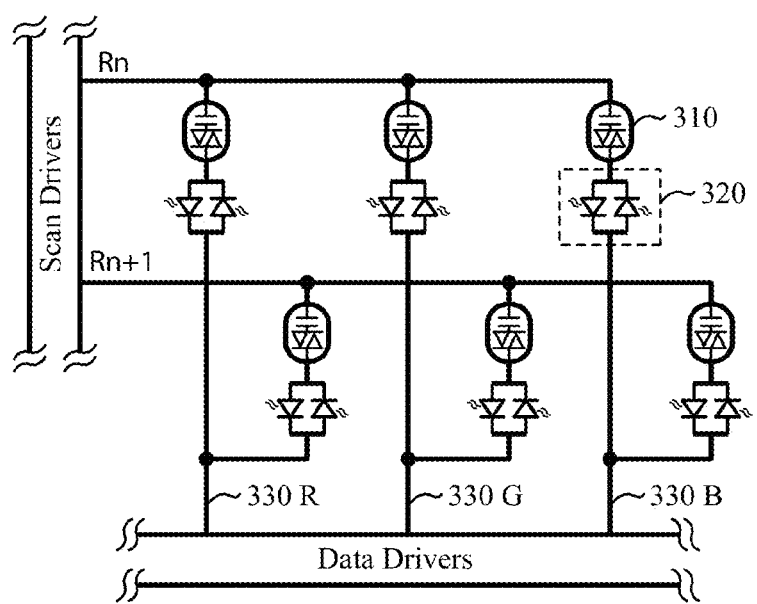
FIG. 3 illustrates a matrix arrangement of illumination cells according to the invention.

FIG. 3 illustrates an exemplary Organic Light Emitting Display Memory Architecture (OLEDMA) embodiment of the invention wherein a plurality of illumination cells each comprise a memory cell 310 coupled, in series, with an illumination element 320. Each memory cell 310 is symbolized as a capacitance in series with a DIAC and each illumination element 320 is symbolized a light emitting diode pair. In preferred embodiments of the invention, organic materials are utilized. Each illumination cell is coupled to a row electrode Rn and a column electrode 330. For a colored pixel, three column electrodes 330 drive red, green or blue illumination elements respectively. An addressable matrix of illumination cells is thus achieved. Each row Rn is driven by a scan driver output capable of applying a row select pulse during an addressing operation. Concurrent with the row selection pulse, data drivers may apply a data pulse according to display data corresponding to an image being displayed. Referring to the operating methods of described in reference to FIG. 2, a combinational writing voltage V1 may be applied between row and column electrodes to effectively create the writing pulse 221 of FIG. 2. That is, individual cells may be addressed (i.e. set to the ON State) by providing portions of a writing pulse voltage to the row electrodes and to the column electrodes in an extended Write Period wherein rows are sequentially selected and image data is applied to column electrodes.

Once an illumination cell has been written, it may be repetitively illuminated by applying driving pulses in an ON period much like applying sustain pulses in a plasma display panel. As each driving pulse is applied, the driving pulse voltage (i.e. V2 of FIG. 2) is applied to display rows, columns or in combination. During the application of a voltage, the cells exhibit a high impedance characteristic until each cell's breakover voltage is reached, wherein the cell exhibits a low impedance characteristic until the completion of the application. Note that while a plasma display has operational limitations during discharge conditions, the OLEDMA cells do not. At the moment when conduction begins, localized voltage drops due to resistance and inductance, will not affect the total charge transferred by the application pulse. The total charge passing through the emissive element is substantially equal to the charge passing though the memory cell capacitance and switch. Since each driving pulse produces limited light output, numerous driving pulses may be applied to reach a desired brightness.

Note that the readback capability, as described, may be utilized by sequentially applying a driving pulse (as in the ON Period) to rows, while data drivers sense the conduction current of ON pixels along each row.

Thus the invention herein described may be utilized to realize a large area memory based full color display technology having uniformly controlled currents.

It should be understood that the foregoing description is only illustrative of the invention. Various alternatives and modifications can be devised by those skilled in the art without departing from the invention. Accordingly, the present invention is intended to embrace all such alternatives, modifications and variances which fall within the scope of the appended claims.

I claim:

1. A device comprising; a breakover conduction memory cell comprising a capacitance coupled to a first terminal and a breakover conduction switch coupled to said capacitance and a second terminal, said breakover conduction switch closing according to a predetermined voltage thereacross.

2. The device of claim 1, said capacitance coupled in series with said breakover conduction switch, wherein said capacitance stores a memory state and said breakover conduction switch closing according to said memory state and said predetermined voltage.

3. The device of claim 1, said breakover conduction switch comprises a breakover characteristic wherein said switch transitions from a first impedance characteristic to a second impedance characteristic according to said predetermined voltage thereacross and transitions from said second impedance characteristic to said first impedance characteristic according to a predetermined current therethrough wherein said second impedance is less than said first impedance.

4. The device of claim 1, wherein said predetermined voltage comprises first and second breakover voltages of opposite polarity.

5. The device of claim 4, wherein said first and second breakover voltages are substantially equal in magnitude.

6. The device of claim 1, said switch comprising at least one of; a PNP transistor, a NPN transistor, a p-channel FET, a n-channel FET, a complementary transistor pair, a thyristor, a DIAC, a SCR, a SIDAC, a thin film transistor, a complementary thin film transistor pair and an organic semi-conductive material.

7. The device of claim 1, further comprising a circuit for applying a first voltage to said memory cell wherein, according to said memory state, a second voltage, across said switch, is greater than said predetermined voltage.

8. The device of claim 7, wherein said memory cell exhibits said first impedance characteristic during a first portion of said applying a pulse and exhibits said second impedance characteristic during a second portion of said applying a pulse.

9. The device of claim 1, further comprising a circuit for reading said memory state of said memory cell.

10. The device of claim 1, further comprising an emissive element coupled to said breakover conduction memory cell having an emission characteristic comprising one or more wavelengths within an emission spectrum ranging from the ultra-violet wavelengths to infrared wavelengths wherein an emission current flows through said emissive element and said memory cell according to said capacitance and said switch.

11. The device of claim 10, wherein said capacitance, said switch and said emissive element are coupled in series.

12. The device of claim 10, said emissive element comprising at least one of; a light emitting diode, and organic light emitting diode, an electroluminescent device, an electroluminescent material, a phosphor and a dischargeable gas.

13. The device of claim 10, further comprising a plurality of said emissive element disposed in series.

14. The device of claim 10, further comprising a plurality of said emissive element disposed in parallel.

15. The device of claim 10, further comprising a plurality of said emissive element disposed in parallel and opposite.

16. The device of claim 10, wherein said emissive element comprises at least one of; a pn junction, p-type semi-conductive material, a n-type semi-conductive material, a polymer and an organic light emitting material.

17. The device of claim 1, further comprising a memory array comprising a plurality of said breakover conduction memory cells said first terminal coupled to a first electrode and said second terminals coupled a plurality of second electrodes respectively.

18. The device of claim 17, said circuit comprising a resonant driving circuit coupled to said memory array, wherein said resonant driving circuit comprises an inductance resonant with said plurality of said breakover conduction memory cells.

19. A method comprising, applying a first voltage across a memory cell comprising a capacitance coupled to a switch, exceeding a first breakover characteristic of said switch and conducting a first current through said capacitance and said switch.

20. The method of claim 19, further comprising applying a second voltage in a second direction, exceeding a second breakover characteristic and conducting a second current through said capacitance and said switch.

21. The method of claim 20, wherein said first current charges said capacitance to a third voltage and said second current charges said capacitance to a fourth voltage.

22. The method of claim 21, wherein the difference between said first voltage and said second voltage is less than or equal to said first breakover characteristic.

23. The method of claim 22, wherein the difference between said third voltage and said fourth voltage is greater than or equal to said first breakover characteristic.

24. The method of claim 19, wherein said capacitance stores a memory state and wherein said first current sets said memory state.

25. The method of claim 19, further comprising reading said memory state, said reading comprising sensing at least one of said first and second currents through said memory cell.

26. An apparatus comprising, a breakover conduction memory cell storing a charge corresponding to a memory state comprising a non-gaseous breakover conduction device.

27. The apparatus of claim 26, said breakover conduction memory cell comprising a capacitance for storing said memory state, and said breakover conduction device conducting according to said memory state, a predetermined voltage thereacross and to a current therethrough.

28. The apparatus of claim 26, said breakover conduction memory cell providing a current through an illumination element according to said memory state.

29. The apparatus of claim 26, comprising an array of said breakover conduction memory cells.

30. The apparatus of claim 26, said breakover conduction memory cell comprising organic semi-conductive materials.

* * * * *